United States Patent [19]
Sumi et al.

[11] Patent Number: 5,397,744
[45] Date of Patent: Mar. 14, 1995

[54] ALUMINUM METALLIZATION METHOD

[75] Inventors: Hirofumi Sumi; Yukiyasu Sugano, both of Kanagawa, Japan

[73] Assignee: Sony Corporation, Tokyo, Japan

[21] Appl. No.: 283,255

[22] Filed: Jul. 29, 1994

Related U.S. Application Data

[63] Continuation of Ser. No. 50,717, Apr. 19, 1993, abandoned, which is a continuation of Ser. No. 836,356, Feb. 18, 1992, abandoned.

[30] Foreign Application Priority Data

Feb. 19, 1991 [JP] Japan .................................. 3-045421
Feb. 21, 1991 [JP] Japan .................................. 3-047338

[51] Int. Cl.$^6$ .......................................... H01L 21/283
[52] U.S. Cl. ..................... 437/200; 437/190; 437/192; 437/194; 437/195; 437/239; 437/241; 148/DIG. 19
[58] Field of Search ............... 437/190, 192, 195, 197, 437/200, 239, 241, 194; 148/DIG. 19, DIG. 147; 257/751, 753, 754, 760

[56] References Cited

U.S. PATENT DOCUMENTS

| 4,551,908 | 11/1985 | Nagasawa et al. | 148/DIG. 19 |
| 4,558,507 | 12/1985 | Okabayashi et al. | 148/DIG. 19 |
| 4,622,735 | 11/1986 | Shibata | 148/DIG. 19 |
| 4,784,973 | 11/1988 | Stevens et al. | 437/200 |
| 4,816,425 | 3/1989 | McPherson | 437/200 |
| 4,818,711 | 1/1989 | Choksi et al. | 437/21 |
| 4,935,804 | 6/1990 | Ito et al. | |
| 4,960,732 | 10/1990 | Dixit et al. | 437/192 |
| 4,965,656 | 10/1990 | Koubuchi et al. | 437/190 |
| 4,990,997 | 2/1991 | Nishida | 357/71 |
| 5,094,981 | 3/1992 | Chung et al. | 437/190 |
| 5,162,262 | 11/1992 | Ajika et al. | 437/200 |
| 5,194,405 | 3/1993 | Sumi et al. | 437/200 |
| 5,290,731 | 3/1994 | Sugano et al. | 437/174 |
| 5,312,775 | 5/1994 | Fujii et al. | 437/192 |

FOREIGN PATENT DOCUMENTS

| 0168828 | 1/1986 | European Pat. Off. | 437/190 |
| 62-237724 | 10/1987 | Japan | 437/190 |
| 1-77122 | 3/1989 | Japan | 437/190 |
| 2-83920 | 3/1990 | Japan | 437/190 |
| 2-260630 | 10/1990 | Japan . | |
| 2083949 | 3/1982 | United Kingdom | 437/200 |

OTHER PUBLICATIONS

*Semiconductor World*, vol. 8, No. 14, 1989, pp. 186–188.
Wolf, S. Silicon Processing, vol. 2, Lattice Press, 1990, pp. 121–134.

Primary Examiner—T. N. Quach
Attorney, Agent, or Firm—Hill, Steadman & Simpson

[57] ABSTRACT

A metallization method in which a fine interconnection hole is filled with an Al-based material and in which low resistance and excellent barrier properties may be achieved simultaneously, is proposed. The present invention resides in improvement in the barrier metal structure. (a) A stack of a TiSi$_2$ layer and a Ti layer, formed by an modified SALICIDE method, and (b) a layer of a Ti-based material rendered amorphous are used. The TiSi$_2$ layer is formed in a self-aligned manner by reacting the silicon substrate with the Ti layer by the interposition of e.g. a thin SiO$_2$ layer and exhibits lower sheet resistance and dense film properties as well as excellent barriering properties. The Ti layer is stacked on the TiSi$_2$ layer for improving wettability with respect to the layer of the Al-based material. The layer of the amorphous Ti-based material is formed by N$_2$ ion implantation into the polycrystalline TiN layer and exhibits superior barrier properties because the crystal grain boundary functioning as the Al diffusion path is destructed. Both of these layers exhibit low sheet resistance as compared to the TiON layer used heretofore as a layer of a material exhibiting excellent barrier properties, while being superior in wettability with respect to the layer of the Al-based material, so that a highly reliable contact may be formed.

5 Claims, 5 Drawing Sheets

ALUMINUM METALLIZATION METHOD

This is a continuation of application Ser. No. 08/050,717 filed Apr. 19, 1993, which was a continuation of U.S. Ser. No. 07/836,356 filed Feb. 18, 1992 both abandoned.

BACKGROUND OF THE INVENTION

1. Field of the Invention

This invention relates to a metallization method applied to preparation of semiconductor devices. More particularly, it relates to a method for forming a contact region having a barrier metal structure with low resistivity, high barrier properties and excellent filling with Al metallization material.

2. Description of the Related Art

Recently, the design rule for semiconductors is becoming finer, as exemplified by VLSIs and ULSIs of recent origin. Concomitantly, the junction is becoming shallower and the aspect ratio of the interconnection hole for establishing electrical connection between an upper metallization and a lower metallization is becoming higher. The upper metallization is usually formed by depositing an Al based material by sputtering. However, under the refined current design rule, malfunctions such as destruction or deterioration of the junction or increase of the contact resistance tend to occur more frequently than heretofore due to Al elution from the upper metallization towards a diffusion layer of the lower metallization or segregation of silicon (Si), usually added to the Al-based material, into contact holes. On the other hand, under the usual sputtering method, it is no longer possible to charge the Al based material with sufficient step coverage into the contact hole having an aspect ratio higher than unity, thus producing breakage of the upper metallization.

It has become customary to provide barrier metal between the upper metallization and the lower metallization as means for preventing an alloying reaction between the upper metallization and the lower metallization or Si segregation. The barrier metal is usually formed of refractory metal silicides or alloys thereof, besides transition metals and transition metal compounds, such as nitrides, carbides, oxynitrides or borides of the transition metals. The barrier metal is provided not only in a single layer, but in a stack of different types of layers.

As a typical example, a dual layer barrier metal structure composed of a stack of a Ti layer and a TiN layer, looking from the substrate side towards the layer of the Al-based material (Ti/TiN based stack) may be used.

The Ti layer exhibits high affinity to oxygen so that it is capable of reducing a native oxide film formed on the surface of an impurity diffusion layer and hence proves to be an excellent material from the viewpoint of stably achieving low resistance ohmic contact. The Ti layer is also excel lent in wettability relative to the Al based material, so that, when the interconnection hole is to be filled with the Al-based material, surface migration of Al atoms may be promoted to achieve uniform filling. However, if used alone, the Ti layer can not satisfactorily fulfil the function as the barrier metal. The reason is that, if a Ti layer is interposed alone between the silicon substrate and the Al-based material layer, both the reaction between Si and Ti and that between Ti and Al proceed simultaneously, so that it is impossible to prevent Al punch-through, that is an aluminum spike.

The TiN layer, on the other hand, is thermodynamically stable with respect to Si and exhibits higher barrier properties than the Ti layer. However, the TiN layer also undesirably exhibits high contact resistance relative to p-type Si. Besides, when the TiN layer is deposited by a vacuum thin film deposition technique, it has the crystal size of the order of 20 nm, while the crystal has a columnar structure, so that, after heat treatment, Al is dispersed into the grain boundary and hence the Al spike again can not be prevented satisfactorily. Besides, if the TiN layer is deposited directly on the silicon substrate, oxygen taken into the layer as impurities tends to be segregated in an interface between the TiN layer and the silicon substrate, so that it is difficult for the TiN layer used alone to provide a low resistance ohmic contact.

For this reason, in the Ti/TiN system, the Ti layer is deposited first on a Si substrate and the TiN layer is subsequently deposited to make the best use of the merits proper to the two layers.

More recently, a two-layer barrier metal composed of a Ti layer and a TiON layer (Ti/TiON system), produced by introducing oxygen during deposition of the TiN layer, has been proposed a view to improving the effects of preventing Al diffusion in the TiN grain boundary by oxygen segregation in the boundary.

On the other hand, a high temperature bias sputtering has recently been proposed as means for combatting insufficient step coverage by the upper metallization. This method resides, as introduced in monthly "Semiconductor World", 1989, December issue, pages 186 to 188 (published by Press Journal KK), heating a wafer to hundreds of degrees centigrade, by a heater block, and effecting sputtering under application of an RF bias by the heater block. With this method, step coverage may be improved by the Al fellow effects and Ion bombardment under the effect of the bias voltage to allow production of a layer of the Al-based material having a planar surface.

It may appear that, when forming a contact having a barrier metal structure, high barriering properties and superior filling by the Al-based upper metallization may be realized simultaneously by using a Ti/TiON based material as a barrier metal and effecting high temperature bias sputtering. However, in effect, this combination leads to the following disadvantages.

The first disadvantage is that the TiON layer exhibits a sheet resistance higher by more than one digit than that of the oxygen-free TiN layer.

The second disadvantage is that after-corrosion becomes more likely to be produced than when the TiN layer is employed. The reason is that $BCl_3$, usually added to a dry etching gas for the Al-based material layer and the barrier metal for reducing a native oxide, is reacted with oxygen in the TiON layer to produce $Cl_2$. Structural factors also add up to such chemical factor to produce the after-corrosion. That is, the TiON layer has rough surface morphology and is inferior to the TiN layer in wettability with respect to the Al-based material, so that the TiON layer tends to provide a site of residence of residual chlorine in an interface between the TiON layer and the layer of the Al-based material.

The third disadvantage is that the TiON layer has a rough surface morphology and is inferior in wettability and reactivity with respect to the Al-based material, so that it is difficult for the fine interconnection holes to be filled uniformly.

It is now assumed that, as shown in FIG. 1, an interlayer insulating film 3 having an interconnection hole 4 is stacked on a Si substrate 1, so that the contact hole reaches an impurity-diffusion region 2 previously formed in the Si substrate 1, and a Ti layer 5 and a TiON layer 6 are stacked as a barrier metal in this order for covering at least the interconnection hole 4. If it is attempted to deposit a layer of an Al-based material 7 on the wafer by high temperature bias sputtering, the interconnection hole 4 can not be filled uniformly, but voids 8 tend to be produced. The reason is that Al is in the intermediate state between a solid state and a liquid state during the high temperature bias sputtering and is highly sensitive to surface morphology of the underlying layer. That is, the TiON layer 6 has a columnar structure and has its crystals so oriented that the longitudinal direction thereof lies substantially orthogonally with respect to the film surface, so that the TiON layer exhibits rough surface morphology.

Thus the present inventors made attempts of stacking a Ti layer, which has proven reactivity and wettability with respect to the Al-based material, on the TiON layer 6, with a view to providing a Ti/TiON/Ti three-layer barrier metal structure. However, surface morphology could not be improved sufficiently by the newly deposited Ti layer, so that the interconnection hole 4 could not be filled with the Al-based material uniformly and with good reproducibility.

OBJECT AND SUMMARY OF THE INVENTION

It is difficult with the prior art technology to form a contact which will satisfy the requirements for low resistivity, high barrier properties and uniform filling of the Al-based metallization material simultaneously. It is therefore an object of the present invention to provide a method for metallization which will satisfy these requirements simultaneously.

It appeared to the present inventors that, as long as it is attempted to realize high barriering properties with the TiON layer, it would be difficult to realize contact formation which will satisfy the requirements for low resistivity and filling by the Al-based upper metallization simultaneously. Thus the present inventors have arrived at a concept of using, as a substitute material, (a) a stacked layer of a $TiSi_2$ layer and a Ti layer produced by the method proposed in our copending JP Patent KOKAI Publication 2-260630 and (b) an amorphous Ti-based layer.

The $TiSi_2$ layer (a) is formed by a method improved over a conventional salicide (self-aligned silicide) process aimed at lowering the contact resistance and the resistance of the diffusion layer. That is, the native oxide on the Si substrate is first removed, a layer of a silicon compound is again formed, a Ti layer is then stacked and heat treatment is performed in an inert atmosphere, instead of directly depositing a Ti layer on a Si substrate and effecting heat treatment, as in the conventional process. Above all, the process employing a silicon oxide layer formed by thermal oxidation as a layer of the Si compound is termed by the present Assignee as SITOX (silicidation through oxide) method, because the siliciding reaction is effected through an oxide layer. The $TiSi_2$ layer, formed by this method, is present selectively only in a device-forming region, without creeping up onto the gate electrode sidewall for achieving an LDD structure in a MOS transistor, or on a field oxide film, so that there is no risk of producing a leakage current between the source/drain region and the gate electrode. Besides, since the rate of the siliciding reaction is low, the film is of uniform and dense quality and exhibits high barrier properties, while advantageously exhibiting low sheet resistance even after high temperature annealing.

According to the present invention, a layer of a titanium silicide layer is formed by reacting the Si-based substrate and a first layer of a titanium-based material through thin silicon compound layer, so as to be used as a barrier metal. An interlayer insulating film is then formed on a substrate surface and an interconnection hole bored so as to reach the Ti-silicide based layer. At this time point, the Ti-silicide layer is exposed to the bottom of the interconnection hole. However, since the Ti-silicide based layer exhibits high thermal stress, stress migration tends to be produced if an Al-based layer is directly deposited thereon. Besides, wettability between the inner wall of the interconnection hole and the Al-based layer is not satisfactory. For this reason, a second layer of a Ti-based material is deposited for covering at least the bottom and the inner wall of the interconnection hole. In this manner, the inner wall of the interconnection hole exhibits improved reactivity and wettability with respect to the Al-based layer, while being reduced in thermal stress. The layer of an Al-based material is then deposited on the overall substrate surface. The Al-based material may now be intruded gradually into the interconnection hole, while undergoing an interface reaction with the Ti-based material, so that the Al-based material may be charged uniformly into the interconnection hole without producing voids.

On the other hand, the amorphous Ti-based material (b) inhibits diffusion of the Al-based material in the grain boundary. The layer of the Ti-based material, deposited by the vacuum thin film deposition technique, exhibits a polycrystalline structure comprised of an aggregate of fine columnar crystals having a particle size of the order of 20 nm. The crystal grain boundary interposed between the crystallized domains provides a path of prompt diffusion for the Al-based material. The conventional practice has been to block the diffusion path by oxygen segregation in the crystal grain boundary. However, the result of the conventional practice is the disadvantages as discussed in connection with the TiON layer. The present inventors have arrived at a concept of destructing the polycrystalline structure to eliminate the crystal grain boundary instead of inactivating the crystal grain boundary by oxygen segregation.

If the crystal grain boundary is eliminated completely, an amorphous state in the strict sense of the term is achieved. However, the object of the present invention is achieved if the single crystals constituting the polycrystalline structure be highly comminuted in size so that the crystal grain boundary can no longer prove to be the path of prompt diffusion. Thus the amorphous state in the context of the present specification means not only the complete amorphous state but also the pseudo amorphous ultra small crystal grain size state. In any case, barrier properties against Al spikes may be improved without deterioration in surface morphology or promotion of the after-corrosion.

The present invention also proposes ion implantation of inactive substances as specific means of achieving the above mentioned amorphous state. By suitably setting operating conditions, such as ion species, implantation energy or dosage, the desired amorphous state of the thin Ti-based material may be achieved with good controllability.

According to the present invention, a low-resistance contact having excellent barrier properties and filling properties by the Al-based metallization material may be produced. Thus the present invention is highly suitable for producing a semiconductor device designed on the basis of the fine design rule to meet the demand for high integration degree, high performance and high reliability.

BRIEF DESCRIPTION OF THE DRAWINGS

FIGS. 9a, 9b and 9c are schematic cross-sectional views showing another example of application of the present invention to the preparation of the MOS-FET, step by step, wherein FIG. 9a shows the state in which a Ti/TiN dual-layer barrier metal structure is stacked for covering an interlayer insulating film having a contact hole bored therein, FIG. 9b shows the state in which the TiN layer is rendered amorphous by Ion implantation, and FIG. 9c shows the state in which an Al-based metallization pattern has been formed.

DETAILED DESCRIPTION OF THE INVENTION

The present invention will be explained with reference to non-limitative Examples.

EXAMPLE 1

In the present Example, the present invention is applied to the production of a MOS-FET. The production process is explained by referring to FIGS. 2 to 7.

Figure 1:
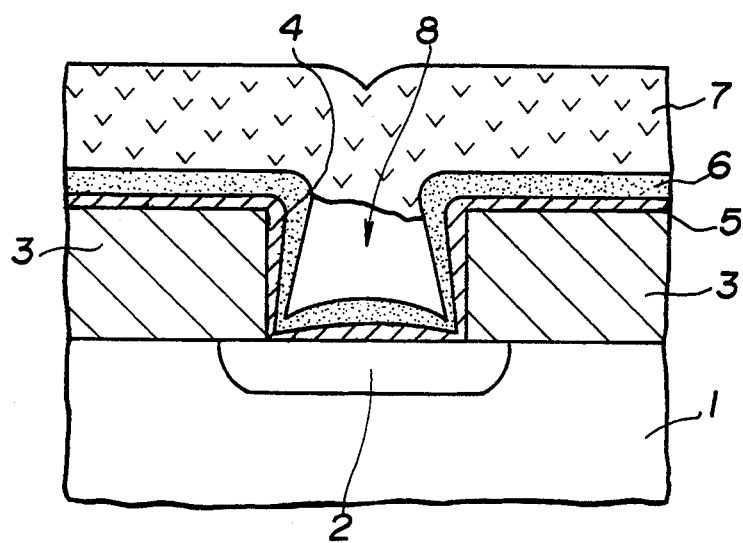
FIG. 1 is a schematic cross-sectional view showing a contact having a conventional barrier metal structure in which the Al-based material is not filled uniformly in the contact hole and voids are produced.
Figure 2:
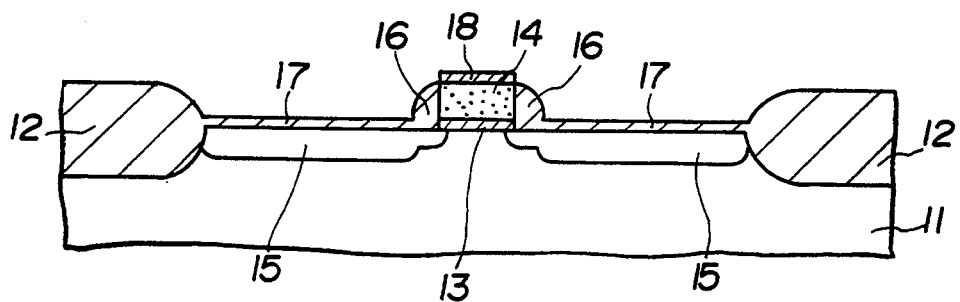
FIG. 2 is a schematic cross-sectional view showing an embodiment in which the present invention is applied to the preparation of a MOS-FET having an LDD structure, and showing the state in which an $SiO_2$ is deposited on a device-forming region and on a gate electrode.

Referring first to FIG. 2, a field oxide film 12 was deposited by e.g. a LOCOS method on a silicon substrate 11, and a gate electrode 14 of e.g. doped polysilicon was deposited, via a gate oxide film 13 of e.g. silicon oxide, on a device-forming region defined by the field oxide film 12.

After first ion implantation, aimed at producing a source-drain region 15, with the gate electrode 14 as a mask, a sidewall 16 of e.g. silicon oxide, was deposited by CVD and RIE processes.

After the native oxide present on the surface of the device-forming region was removed with dilute hydrofluoric acid, $SiO_2$ layers 17, 18, each 5 nm thick, were formed by e.g. thermal oxidation on the device-forming region and on the gate electrode 14. The native oxide was previously removed for providing a uniform thickness of the $SiO_2$ layer 17 on the device-forming region. Instead of producing the $SiO_2$ layers 17, 18 by oxidizing the wafer surface, a polysilicon layer may be deposited on the entire wafer surface and then converted to a thick $SiO_2$ layer by thermal oxidation thereof, with the film thickness being then reduced to a desired thickness by subsequent etching with dilute hydrofluoric acid.

Then, using the gate electrode 14 and the sidewall 16 as masks, second ion implantation was effected through the $SiO_2$ layer 17, for raising the impurity concentration at a portion of the source-drain region 15. An LDD structure may be realized in this manner. The $SiO_2$ layer 18 on the gate electrode 14 also functions as a layer for inhibiting channeling otherwise produced by the implanted ions.

Then, Ti sputtering was effected under exemplary conditions of an Ar flow rate of 100 SCCM, a gas pressure of 0.47 Pa (3.5 mTorr), a dc sputtering power of 4 kW, a substrate temperature of 300° C. and a sputtering rate of 350 nm/min for depositing a first Ti layer 19 to a thickness of the order of 30 nm on the entire wafer surface.

Figure 3:
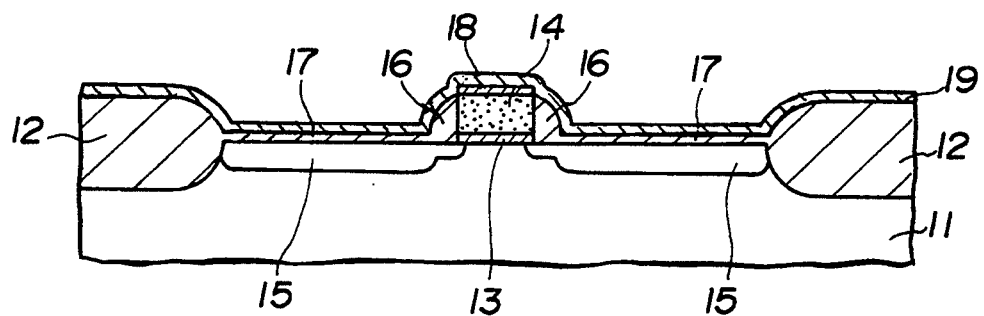
FIG. 3 is a schematic cross-sectional view showing the state in which a first Ti layer is deposited on the entire surface of a substrate shown in FIG. 2.

The wafer shown in FIG. 3 was lamp-annealed at approximately 650° C. in an Ar atmosphere for reacting a part of the first Ti layer 19 with the Si substrate 11 (more accurately, the source-drain region 15) and the gate electrode 14 through the $SiO_2$ layers 17 and 18 for producing TiSi layers, not shown.

Then, using a mixed solution of e.g. ammonia and aqueous hydrogen peroxide, non-reacted part of the first Ti layer 19 was selectively etched off.

Figure 4:
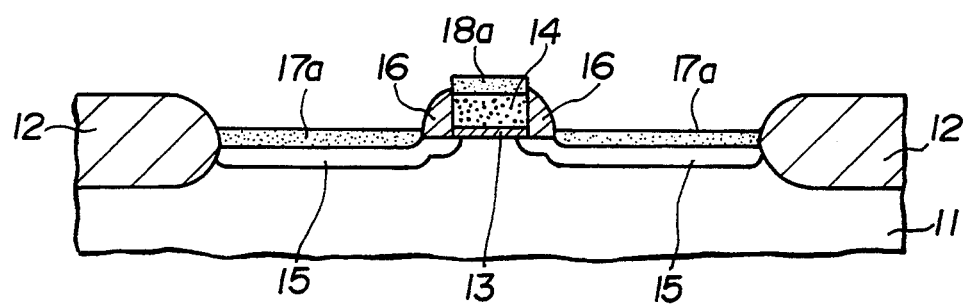
FIG. 4 is a schematic cross-sectional view showing the state in which a $TiSi_2$ layer is selectively formed by a siliciding reaction on a source-drain region and on a gate electrode.

The TiSi layers, the Si substrate 11 and the gate electrode 14 were further reacted by second lamp-annealing at 900° C. for producing $TiSi_2$ layers 17a, 18a, as shown in FIG. 4.

Meanwhile, siliciding lamp-annealing is effected in two stages for producing the $TiSi_2$ layers 17a, 18a on the device-forming region and on the gate electrode with good selectivity. If siliciding is effected in the neighborhood of 900° C. from the outset, the $TiSi_2$ layers 17a, 18a are extended as far as the field oxide film 12 or on the sidewall 16 with an increased risk that the leakage current between the gate electrode 14 and the source/drain region 15 be increased.

Figure 5:
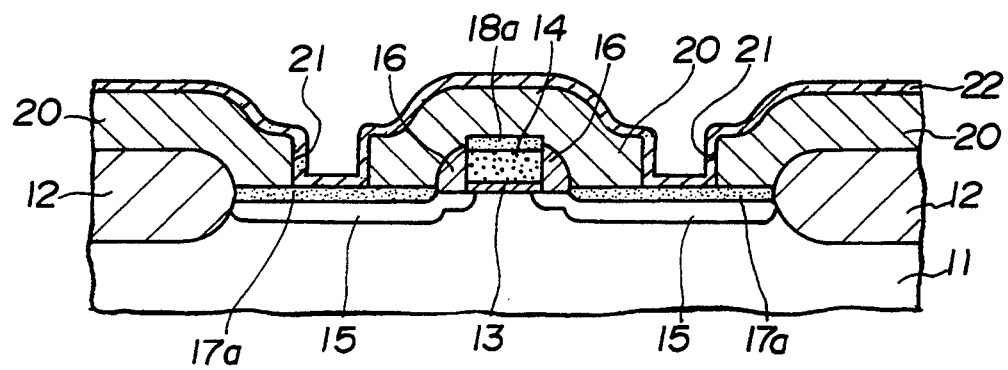
FIG. 5 is a schematic cross-sectional view showing the state in which a contact hole reaching the $TiSi_2$ layer is formed by patterning of the interlayer insulating film and a second Ti layer is deposited on the entire substrate surface.

Then, as shown in FIG. 5, an interlayer insulating film 20 was formed by depositing silicon oxide etc. on the entire wafer surface by CVD. The insulating film 20 was then patterned for forming a contact hole 21 reaching the $TiSi_2$ layer 17a on the source-drain region 15. A second Ti layer 22 was then deposited to a thickness of the order of 50 nm over the entire wafer surface by sputtering under the same conditions as those for depositing the first Ti layer 19. In this manner, at least the bottom surface and the sidewall of the contact hole 21 were coated by the second Ti layer 22 for improving wettability and reactivity of the subsequently deposited Al-1%Si layer 23 (FIG. 6) and the contact part for releasing thermal stress from the TiSi$_2$ layer 17a.

Figure 6:
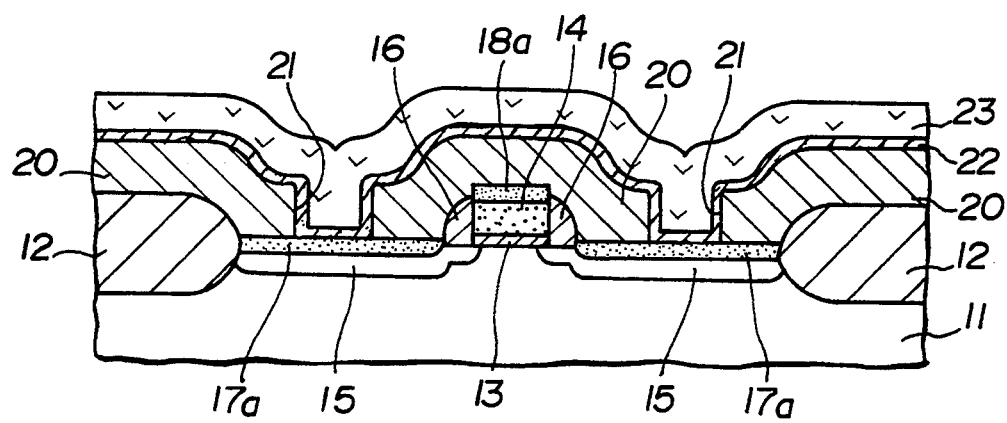
FIG. 6 is a schematic cross-sectional view showing the state in which an Al-1%Si layer has been formed on the entire substrate surface shown in FIG. 5.

The Al-1%Si layer 23 was then deposited by two-step sputtering. The flow rate of Ar as a sputtering atmosphere was set to 100 SCCM, and a gas pressure was set to 0.47 Pa (3.5 mTorr). The first stage sputtering was effected with a dc sputtering power of 22.7 kW, without heating the substrate or applying a bias voltage, for forming the Al-1%Si layer 23 to a thickness of the order of 100 nm. The second stage high temperature sputtering was effected by contacting the back side of the substrate with a hot Ar gas for heating the substrate to about 450° C. and by applying an RF bias power of 300 V for depositing the Al-1%Si layer 23 to an additional thickness of 300 nm. In this manner, the Al-1%Si layer 23 was ultimately formed on the entire wafer surface to a thickness of 400 nm, as shown in FIG. 6, and the contact hole 21 was uniformly filled without forming voids.

Meanwhile, it is not absolutely necessary to deposit the Al-1%Si layer 23 by the above mentioned dual-stage process. However, if the substrate were heated from the outset to elevated temperatures, the Al-1%Si layer 23 would be grown in the form of islands, depending on conditions. For avoiding such situation, the film depositing process is divided into two steps and the first step is designed as a low temperature process. This leads to improved film quality of the Al-1%Si layer 23.

Figure 7:
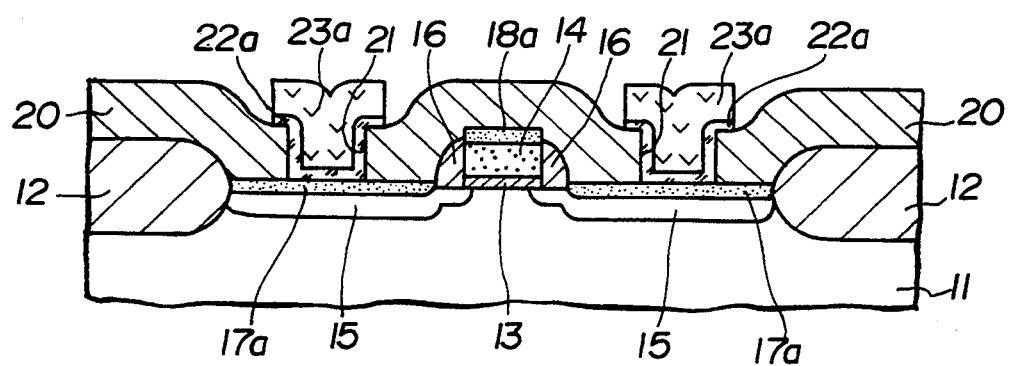
FIG. 7 is a schematic cross-sectional view showing the state in which an Al-based metallization pattern is formed by patterning.

Then, as shown in FIG. 7, the Al-1%Si layer 23 and the second Ti layer 22 were etched, using Cl-based gases, for forming an Al-based metallization pattern 23a, having a pattern 22a of a Ti layer as an underlying layer.

With the MOS-FET produced by the present Example, the sheet resistance of the source-drain region 15 and the gate electrode 14 is decreased by the TiSi$_2$ layers 17a, 18a, so that the junction leakage current is lowered significantly even after high temperature annealing, as compared with that of the MOS-FET in which the silicide layer is formed by the conventional SALICIDE method. This is in keeping with superior film quality of the TiSi$_2$ layers 17a, 18a produced by the SITOX method.

Figure 8:
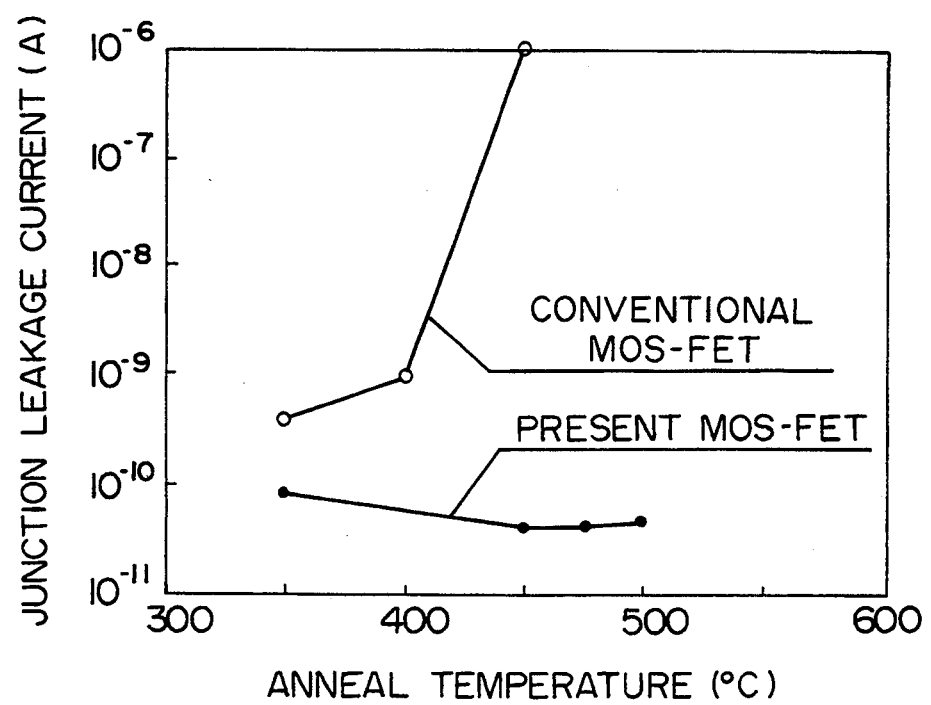
FIG. 8 is a comparative graph showing the annealing temperature dependency of the junction leakage current of the MOS-FET produced according to the present invention and the conventional MOS-FET.

The chart of FIG. 8 shows the measured results of the junction leakage current on applying a voltage of $-5.5$ V to a gate electrode of the MOS-FET maintained for 30 minutes at a predetermined annealing temperature. In this figure, the ordinate represents a junction leakage current (A) and the abscissa represents the annealing temperature (°C.). White circular plots (o) and black square-shaped plots (■) represent data for the conventional MOS-FET and those for the MOS-FET of the present Example, respectively. In the conventional MOS-FET, TiSi$_2$ crystals tend to be aggregated by high temperature annealing to increase the sheet resistance. Besides, resistance against Al spiking is deteriorated when the substrate is heated to 400° C. so that the junction leakage current is increased acutely. Conversely, with the MOS-FET produced by the present Example, since the TiSi$_2$ layers 17a, 18a display larger crystal grain size and a dense grain boundary, diffusion of Ti and Si is suppressed even after heating to 500° C., so that the sheet resistance is maintained at a lower value. Besides, the junction leakage current was substantially unchanged and high resistance against Al spiking could be maintained. This indicates that the MOS-FET of the present Example is not deteriorated in characteristics even after high temperature sputtering in the course of deposition of the Al-1%Si layer 23.

EXAMPLE 2

Figure 9A:
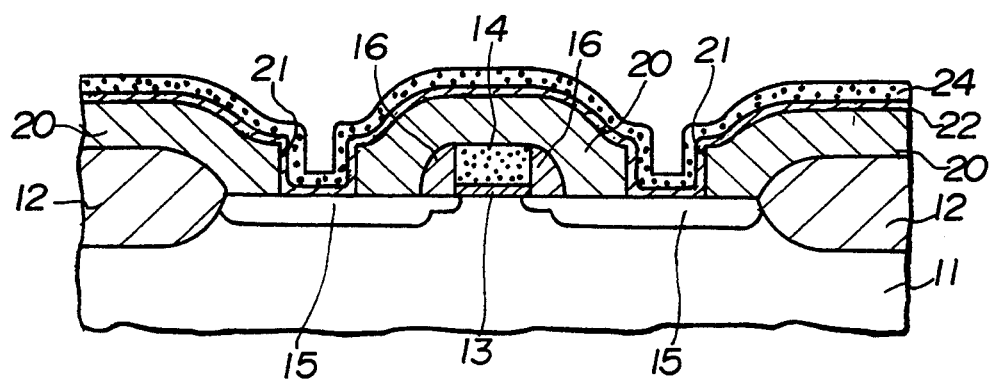

In the present Example 2, the present invention is applied to contact formation in a source-drain region of a MOS-FET and an amorphous state is achieved by ion implantation of N$_2$ in the TiN layer. The process is explained by referring to FIGS. 9a to 9c. Meanwhile, part of the reference numerals in FIGS. 9a to 9c are the same as the reference numerals used in FIGS. 2 to 7.

A field oxide film 12, a gate oxide film 13, a gate electrode 14, a sidewall 16, a source-drain region 15, an interlayer insulating film 20 and a contact hole 21 were formed on a Si substrate 11 in accordance with a customary process for preparation of the MOS-FET. A Ti/TiN dual-layered barrier metal was then formed. The lower Ti layer 22 was deposited to a thickness of the order of 30 nm by sputtering under exemplary conditions of an Ar flow rate of 50 SCCM, a gas pressure of 0.47 Pa (3.5 mTorr), a dc sputtering power of 4 KW and a substrate temperature of 300° C.

The upper TiN layer 24 was deposited to a thickness of the order of 70 nm by sputtering under exemplary conditions of an N$_2$ flow rate of 50 SCCM, a gas pressure of 0.47 Pa (3.5 mTorr) a dc sputtering power of 6KW and a substrate temperature of 300° C.

Figure 9B:
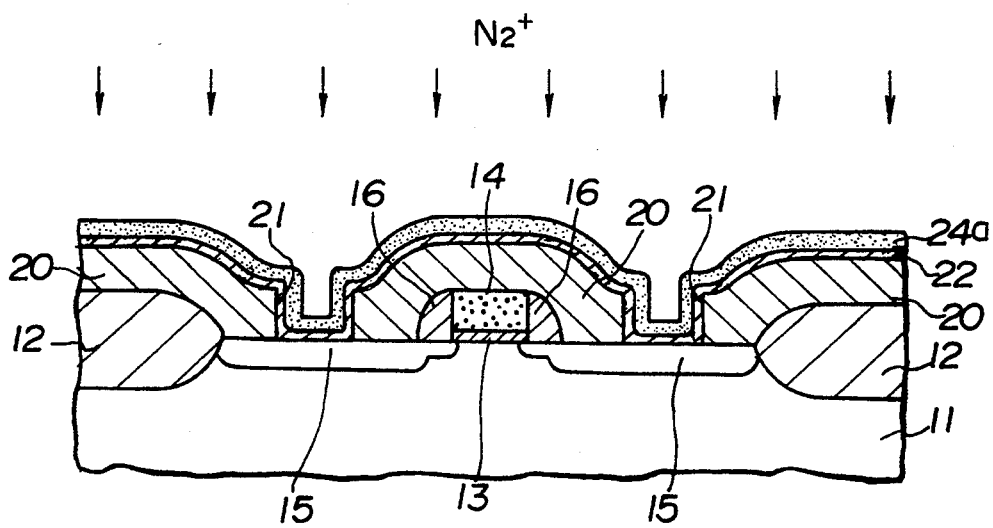
Figure 9C:
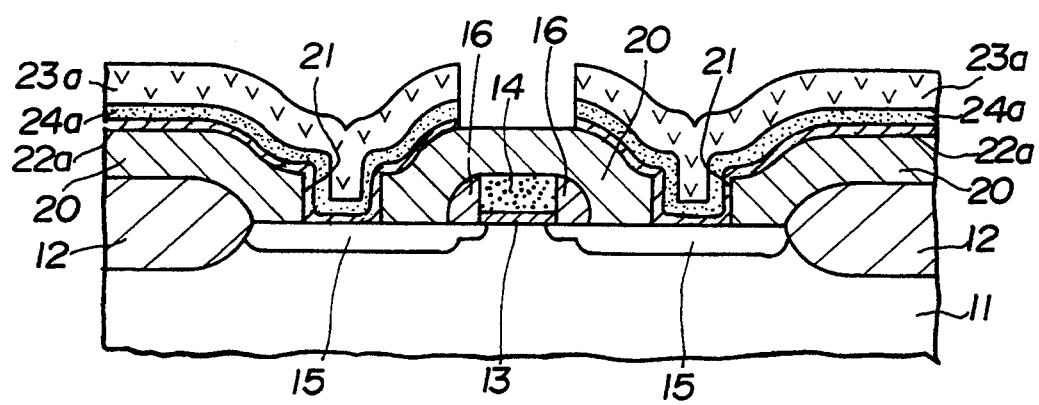

N$_2$ ion implantation was then effected on the entire wafer surface, under conditions of an implantation energy of 50 keV and a dosage of $5 \times 10^{15}$ atoms/cm$^2$ for converting the TiN layer 24 into an amorphous TiN layer 24a, as shown in FIG. 9b.

An Al-1%Si layer was deposited by sputtering to a thickness of the order of 400 nm, under sputtering conditions of an Ar flow rate of 100 SCCM, a gas pressure of 0.47 Pa (3.5 mTorr), a dc sputtering power of 22.7 kW and a substrate temperature of 200° C. At this time, the entire wafer surface was coated with the Al-1%Si layer and the inside of the contact hole 21 was uniformly filled without producing voids.

Finally, dry etching was effected, using a Cl-based mixed gas, such as BCl$_3$/Cl$_2$, for simultaneously patterning the Al-1%Si layer, the amorphous TiN layer 24a and the Ti layer 22 for producing an Al-based metallization pattern 23a, as shown in FIG. 9c, in which as-patterned layers are indicated by reference numerals for the original layers with suffix letters a appended thereto. After the end of dry etching, no severe after-corrosion as met when using the TiON layer as the upper layer for the two-layer barrier metal structure was not observed.

For ascertaining barrier properties of the amorphous TiN layer 24a in the so-formed MOS-FET, an electrical voltage of $-5.5$ V was applied to a gate electrode of the MOS-FET maintained at a predetermined temperature for 30 minutes for measuring the junction leakage current. It was found that, even after annealing at 600° C., there was no increase in the leakage current flowing through the MOS-FET. This indicates that the amorphous TiN layer 24a is not reacted with Al even at 600° C. but functions satisfactorily as an effective barrier metal structure to prevent Al punch-through to the source-drain region 15.

Although the present invention has been explained with reference to two preferred embodiments, the present invention is not limited to these illustrative embodiments.

For example, the layer of the silicon compound interposed between the silicon-based substrate and the first layer of the titanium-based material may also be a silicon nitride ($Si_3N_4$) layer, in addition to the above mentioned $SiO_2$ layer 17.

Also, ion implantation for rendering the TiN layer 24 amorphous may also be effected only in the vicinity of a contact, using a suitable mask, instead of on the entire wafer surface. The implanted inactive material may also be Ar, $H_2$ or Ti, instead of $N_2$, as mentioned above, if the implanted substance is not likely to produce acute changes in the chemical properties of TiN.

What is claimed is:

1. A metallization method comprising the steps of:
   providing a silicon substrate,
   removing a native oxide layer from a substrate surface to form a clean surface,
   forming a new layer of a uniform thickness of a silicon compound selected from $SiO_2$ and $Si_3N_4$ on the clean surface,
   forming a first layer of titanium on the new layer,
   forming a layer of $TiSi_2$ from the first layer by effecting heat treatment in an inert gas atmosphere,
   forming an interlayer insulating film on said layer of $TiSi_2$ and forming an interconnection hole having a base and sidewall in said interlayer insulating film so that said hole reaches said layer of the $TiSi_2$,
   coating at least the base and the sidewall of said interconnection hole with a second layer of the titanium, and
   forming a layer of metal selected from aluminum and aluminum alloys for filling at least said interconnection hole.

2. A metallization method comprising the steps of:
   providing a silicon substrate,
   removing a native oxide from a substrate surface to form a clean surface,
   forming a new layer of a uniform thickness of a silicon compound on the clean surface,
   forming a first layer of titanium on the new layer,
   forming a layer of $TiSi_2$ from the first layer by effecting heat treatment in an inert gas atmosphere,
   forming an interlayer insulating film on said layer of $TiSi_2$ and forming an interconnection hole having a base and sidewall in said interlayer insulating film so that said hole reaches and exposes a surface of said layer of the $TiSi_2$,
   coating at least the base and the sidewall of said interconnection hole with a second layer of the titanium, and
   forming a layer of metal selected from aluminum and aluminum alloys for filling at least said interconnection hole.

3. A metallization method according to claim 2, wherein said silicon compound is $SiO_2$ formed by thermal oxidation.

4. A metallization method according to claim 2, wherein said silicon compound is $SiO_2$ formed by the steps of depositing a polycrystalline silicon layer on the substrate, subjecting the polycrystalline silicon layer to a thermal oxidation to form a thick $SiO_2$ layer and etching the thick $SiO_2$ layer to form a $SiO_2$ layer having a desired thickness.

5. A metallization method according to claim 2, wherein said silicon compound is $Si_3N_4$.

* * * * *